(12) United States Patent
Negrut

(10) Patent No.: US 7,746,653 B2
(45) Date of Patent: Jun. 29, 2010

(54) CLAMP FOR ELECTRICAL DEVICES

(75) Inventor: Florin Negrut, Southfield, MI (US)

(73) Assignee: Harman International Industries Incorporated, Northridge, CA (US)

( * ) Notice: Subject to any disclaimer, the term of this patent is extended or adjusted under 35 U.S.C. 154(b) by 180 days.

(21) Appl. No.: 11/968,532

(22) Filed: Jan. 2, 2008

(65) Prior Publication Data

US 2009/0168360 A1 Jul. 2, 2009

(51) Int. Cl.
*H05K 7/20* (2006.01)
*H01L 23/34* (2006.01)
*A44B 21/00* (2006.01)

(52) U.S. Cl. .................. 361/719; 361/709; 257/718; 257/719; 257/E23.103; 24/458; 24/459; 24/520; 165/80.2; 165/185

(58) Field of Classification Search ............... 361/704, 361/709, 719; 257/718, 719, E23.103, 726; 24/458, 459, 520; 165/80.2, 185
See application file for complete search history.

(56) References Cited

U.S. PATENT DOCUMENTS

| | | | |
|---|---|---|---|
| 3,552,630 A * | 1/1971 | Dean | 228/46 |
| 3,911,327 A | 10/1975 | Murari et al. | |
| 4,342,068 A | 7/1982 | Kling | |
| 4,631,819 A | 12/1986 | Lasier et al. | |
| 4,695,924 A | 9/1987 | Wozniczka | |
| 4,707,726 A | 11/1987 | Tinder | |
| 4,853,762 A | 8/1989 | Ewer et al. | |
| 4,964,198 A | 10/1990 | McCarthy | |
| 5,099,550 A | 3/1992 | Beane et al. | |
| 5,109,318 A | 4/1992 | Funari et al. | |
| 5,201,866 A | 4/1993 | Mok | |
| 5,307,236 A * | 4/1994 | Rio et al. | 361/720 |
| 5,368,094 A | 11/1994 | Hung | |
| 5,369,879 A | 12/1994 | Goeschel et al. | |
| 5,377,078 A | 12/1994 | Kalis | |
| 5,437,561 A | 8/1995 | Earl et al. | |
| 5,483,103 A * | 1/1996 | Blickhan et al. | 257/718 |
| 5,587,608 A | 12/1996 | Meng | |
| 5,615,735 A | 4/1997 | Yoshida et al. | |
| 5,640,304 A | 6/1997 | Hellinga et al. | |
| 5,896,270 A | 4/1999 | Tsui | |
| 5,912,804 A | 6/1999 | Lawson et al. | |
| 6,043,981 A * | 3/2000 | Markow et al. | 361/704 |
| 6,045,653 A | 4/2000 | Johnson | |
| 6,049,459 A * | 4/2000 | Edmonds et al. | 361/707 |

(Continued)

*Primary Examiner*—Zachary M Pape
(74) *Attorney, Agent, or Firm*—Brinks Hofer Gilson & Lione

(57) ABSTRACT

An assembly for clamping electrical components against a heat-dissipating surface of a heat sink may include the heat sink, one or more electrical components, two or more springs, and a fastener. Each of the springs may include a first surface, and a second surface opposite the first surface. The second surface of each of the springs may include an attachment region and two contact regions. The attachment region may be between the two contact regions. The second surface of one of the springs may overlap the first surface of another one of the springs. Each of the springs may be positioned to hold the electrical components against the heat dissipating surface of the heat sink. Each of the two contact regions of each of the springs may be positioned to hold the electronic components against the heat-dissipating surface. The fastener may couple the springs together in the attachment region of each of the springs and may further couple the springs to the heat sink.

23 Claims, 9 Drawing Sheets

U.S. PATENT DOCUMENTS

| | | |
|---|---|---|
| 6,088,226 A | 7/2000 | Rearick |
| 6,154,365 A | 11/2000 | Pollard, II et al. |
| 6,177,727 B1 | 1/2001 | Hart, Jr. et al. |
| 6,304,449 B1 | 10/2001 | Zhang |
| 6,323,437 B1 | 11/2001 | Johnson |
| 6,350,952 B1 | 2/2002 | Gaku et al. |
| 6,535,389 B2 | 3/2003 | Rodriguez et al. |
| 6,587,344 B1 | 7/2003 | Ross |
| 6,707,676 B1 | 3/2004 | Geva et al. |
| 6,714,414 B1 | 3/2004 | Dubovsky et al. |

* cited by examiner

CLAMP FOR ELECTRICAL DEVICES

BACKGROUND OF THE INVENTION

1. Technical Field

The field of invention relates generally to clamps. In particular, the invention relates to holding electrical components in thermal contact with a heat sink.

2. Related Art

Electrical components may be installed in many different configurations. An electrical component can be any now known or later discovered electrical device such as a transformer, an integrated circuit, a microchip, a semiconductor device, a central processing unit, a diode, a passive device, etc. Electrical components often generate heat. In some cases, if not effectively cooled, electrical components can overheat resulting in improper functioning of, damage to, or even destruction of the electrical components. Heat sinks may be used to cool electrical components to prevent overheating. A heat sink may be any heat-conducting material formed in a shape designed to draw heat away from a surface of the heat sink.

Configurations that include a heat sink may use surface mounted technology (SMT), where electrical components are mounted on the surface of a printed circuit board (PCB) that is interspersed between the electrical components and a heat sink. Other configurations may use lay down components, where electrical components pass through cutouts in the PCB so that the electrical components contact the heat sink. In still other configurations, lay down components are located close to the edge of the PCB so that the electrical components extend beyond the edge and contact the heat sink. Other example configurations use stand-up components where the heat sink may contact the electrical component on a side of the electrical component opposite of a side of the electrical component facing the PCB. In other configurations using stand-up components, the heat sink may contact a side of electrical component that is substantially perpendicular to the PCB, particularly if the electrical component is positioned near the edge of the PCB. It is understood that a given configuration may contain any combination or variation of the configurations described above.

In some configurations, clamping heat-generating electrical components against a surface of a heat sink—or against a surface in thermal contact with the heat sink—may increase the effectiveness of the heat sink. However, the characteristics of the given configuration may impose limitations on what apparatus may be used to clamp the heat-generating electrical components against the surface of a heat sink. For example, the limiting characteristics of a given configuration may include: the number of electrical components to be clamped, the amount of clamping force required for efficient heat transfer, the amount of force the electronic component is capable of sustaining and maintaining proper functionality (e.g., without the electronic component cracking or being crushed), the amount of space available for the clamping apparatus, the cost of manufacturing or installing the clamping apparatus, etc.

SUMMARY

An example of an assembly for clamping electrical components against a heat-dissipating surface of a heat sink may include the heat sink, one or more electrical components, two or more springs, and a fastener. The springs may hold the one or more electrical components against the heat-dissipating surface of the heat sink and the fastener may couple the springs to the heat sink.

Each of the springs may include a first surface, and a second surface opposite the first surface. The second surface of each of the springs may include an attachment region and two contact regions, where the attachment region is between the two contact regions. The second surface of one of the springs may overlap the first surface of another one of the springs. Each of the springs may be positioned to hold the electrical components against the heat dissipating surface of the heat sink, where each of the two contact regions of each of the springs may be positioned to hold the electronic components against the heat-dissipating surface. The fastener may couple the springs together in the attachment region of each of the springs. The fastener may also couple the springs to the heat sink. The fastener may be a single fastener. The fastener may couple the springs to the heat sink through a gap between two of the electrical components.

The above example assembly may be useful, for example, in a configuration that includes four electrical components arranged compactly along a single axis, where the configuration only has room for a fastener, the contact regions of a clamping assembly extend the full width of the electrical components, and the springs and the fastener remain within a region defined by the outer edges of the electrical components. The example assembly may also be useful in other configurations.

An interesting aspect of the assembly is that a central region of the second surface of each of the springs may have a concave shape facing the heat-dissipating surface. Each of the contact regions of each of the springs may have a convex shape facing the heat-dissipating surface.

Alternatively, a heat sink clamp for holding semiconductor devices against a mounting surface of a heat sink may include two or more springs and a fastener assembly. The two or more springs may hold the semiconductor devices against the mounting surface and the fastener assembly may couple the springs to the heat sink.

Each of the springs may have a first axis and a second axis, where the second axis is perpendicular to the first axis. The first axis of each of the springs may have a first length, and the second axis of each of the springs may have a second length. In each of the springs, the first length of the first axis may be longer than the second length of the second axis. The first length of each of the springs may be different from the first length of every other one of the springs.

Each of the springs may also have a contact point and an attachment point positioned at different locations on the first axis. The contact point of each of the springs may hold a different semiconductor device in thermal contact with the mounting surface than semiconductor devices held by the other springs. The fastener assembly may couple the springs together at the attachment point of each of the springs.

A method of clamping electrical components against a heat sink surface may include positioning electrical components in thermal contact with a heat sink surface. Each of the electrical components may include a first side and a second side, where the second side is opposite of the first side. The second side of each of the electrical components may face the heat sink surface.

The method of clamping may also include providing a clamp that includes springs. The method of clamping may include placing a contact end of each of the springs in contact with the first side of one of the electrical components, where the contact end of each of the springs contacts the first side of a different electrical component than is in contact with the contact end of the other springs. The method of clamping may include placing a fastening point of each of the springs adjacent to all other fastening points of the springs. The method of clamping may include coupling the springs together at the fastening point of each of the springs with a fastener.

Next, the method of clamping may include moving the fastener in the direction of the heat sink surface causing the springs to deform and the first contact end of each of the springs to clamp, against the heat sink surface, the electrical components that are in contact with the contact end of each of the springs.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1A:
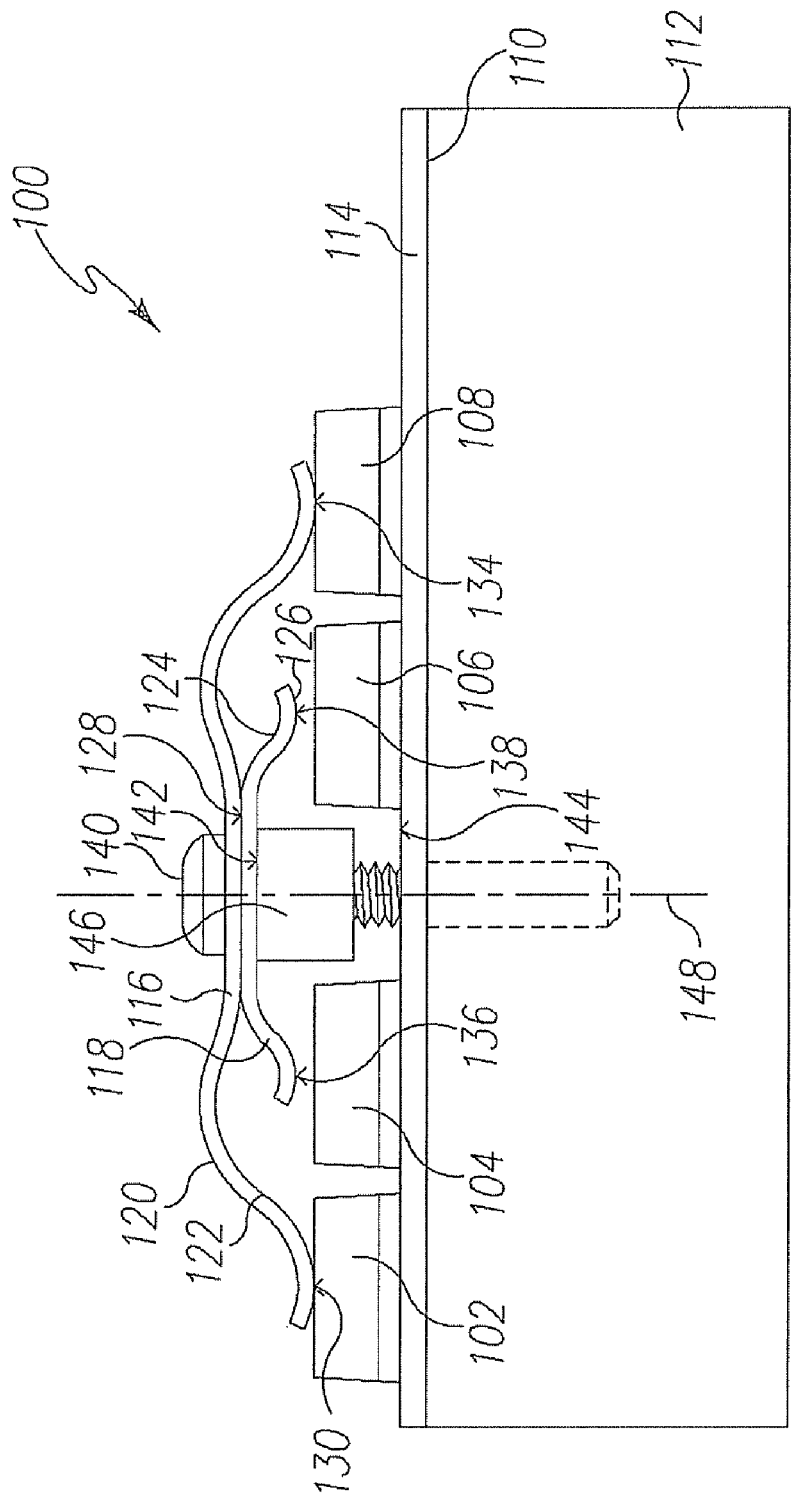
FIG. 1A illustrates a side-view of an example of an assembly for clamping electrical components against a heat-dissipating surface.

FIG. 1A illustrates a side-view of an example of an assembly 100 for clamping electrical components against a heat-dissipating surface 110. The assembly 100 may contain first, second, third, and fourth electrical components, 102, 104, 106, and 108. The assembly 100 may contain a first and second resilient member, 116 and 118. The first, second, third, and fourth electrical components, 102, 104, 106, 108, may be held against a circuit board 114 using the first and second resilient members, 116 and 118.

The electrical components, 102, 104, 106, or 108, may be any single device or combination of devices, now known or later discovered, with two or more leads to which a voltage may be applied to perform a function, such as a transformer, an integrated circuit, a microchip, a semiconductor device, a central processing unit, a diode, a passive electrical device, resistor, etc. The assembly may include one or more electrical components.

Each of the resilient members, 116 and 118, is a distinct part that may be constructed of any sufficiently resilient material, such as steel, to provide enough clamping force when deformed to facilitate efficient cooling and to be flexible enough to deform under that clamping force. In particular, the physical properties of the resilient members, 116 and 118, may be varied to achieve a certain clamping force. Determining the appropriate physical properties of the resilient members, 116 and 118, may involve applying engineering formulas from solid mechanics to certain variables. The variables may include, among others: the relative geometry, (thickness, profile shape, width, length, etc.) of the resilient members, 116 and 118, the amount of deformation of the resilient members, the material composition of the resilient members, and the amount of force to be exerted on the resilient members and electrical component(s). For example, the resilient members, 116 and 118, may be substantially flat, and have a rectangular cross-section. In other examples, the resilient members, 116 and 118, may have a circular cross-section. In still other examples, the resilient members, 116 and 118, may have a "U" or "L" shaped cross-section. The assembly may include more than two resilient members.

the circuit board 114, or printed circuit board, is used to mechanically support and electrically connect electrical components using electrically conductive pathways on an electrically non-conductive substrate. The circuit board 114 may be thermally conductive.

The heat-dissipating surface 110 is a thermally conductive surface of a heat sink 112. The heat sink 112 may be any object that is used to absorb and dissipate heat from another object using thermal contact (either direct or radiant).

In some examples, the electrical components 102, 104, 106, and 108, may fit through cutout openings (not shown) in the circuit board 114 and be held against the heat-dissipating surface 110 of a heat sink 112. A thermally conductive material (not shown) may be interspaced between the electrical components, 102, 104, 106, 108, and the heat-dissipating surface 110. The electrical components may be arranged along a single axis as shown in FIG. 1A. Alternatively, the electrical components may be arranged randomly or provided in some other arrangement, such as in a circle, a rectangle, or an asymmetric pattern, etc.

The first resilient member 116 may include a first surface 120, and a second surface 122 opposite the first surface 120. The second resilient member 118 may also include a first surface 124, and a second surface 126 opposite the first surface 124. The second surface 122 of the first resilient member 116 may overlap the first surface 124 of the second resilient member 118 in an attachment region 128 of the second surface 122 of the first resilient member 116. The attachment region 128 of the second surface 122 of the first resilient member 116 may be defined by the portion of the second surface 122 of the first resilient member 116 that overlaps the first surface 124 of the second resilient member 118.

The second surface 122 of the first resilient member 116 may include a first contact region 130 and a second contact region 134. The second surface 126 of the second resilient member 118 may also include a first contact region 136 and a second contact region 138. The first contact region 130 of the first resilient member 116 may hold the first electrical component 102 against the circuit board 114 or the heat-dissipating surface 110 when a fastener 140 couples the first and second resilient members, 116 and 118, to the heat sink 112. The second contact region 134 of the first resilient member 116 may hold the fourth electrical component 108. The first contact region 136 of the second resilient member 118 may hold the second electrical component 102 against the circuit board 114 or the heat-dissipating surface 110. The second contact region 138 of the second resilient member 118 may hold the third electrical component 106. In other examples, each resilient member may have any number of contact regions.

A contact region, 130, 134 136 or 138, may be a portion of the second surface, 122 or 126, of each of the resilient members, 116 and 118, that may contact an electrical component, 102, 104, 106, or 108, or contact an object inserted between at least one of the resilient members, 116 and 118, and the electrical component, 102, 104, 106, or 108. In another example, the contact region, 130, 134 136 or 138, may also include a portion of the second surface, 122 or 126, of each of the resilient members, 116 and 118, that is defined by planes that include the sides of the electrical component, 102, 104, 106, or 108, held by the contact region, where the sides are perpendicular to the heat dissipating surface 110.

The assembly 100 may include the fastener 140. The fastener 140 may be a single fastener, or multiple fasteners, and be any now known or later discovered fastener, such as a screw, bolt, rivet, weld, barb fit into an aperture of the circuit board 114, etc. The fastener 140 may pass through the attachment region 128 of the second surface 122 of the first resilient member 116 and through an attachment region 142 of the second surface 126 of the second resilient member 118. The attachment region, 128 and 142, of each resilient member, 116 and 118, may be a portion of the second surface, 122 or 126, between the first and second contact regions, 130 and 134 or 136 and 138, of each resilient member, 116 and 118. The fastener 140 may pass through a gap 144 formed between the second and third electrical components, 104 and 106, in order to couple the resilient members to the heat sink 112. In some examples, the fastener 140 may pass through a gap formed between any other components.

The fastener 140 may also pass through an aperture of a spacer 146 positioned between the resilient members and the heat sink 112. Alternatively, the spacer 146 may be positioned next to the fastener 140. In still other examples, the clamping assembly may not include a spacer 146. The spacer 146 may limit the deformation of the resilient members and hence limit the force exerted on electrical components. For example, without the spacer, if the fastener 140 were a screw, the screw may be over-tightened during installation of the clamping assembly. If a spacer is used, an over-tightened screw may not further deform the resilient members and consequently may not apply too much clamping force.

The first resilient member 116 may or may not be symmetric about the attachment region 128. The second resilient member 118 may or may not be symmetric about the attachment region 142. In another example, the resilient members may both be symmetric about a single axis 148 that intersects the resilient members, 116 and 118. Alternatively, one or more resilient members may be asymmetric about the single axis 148.

Figure 1B:
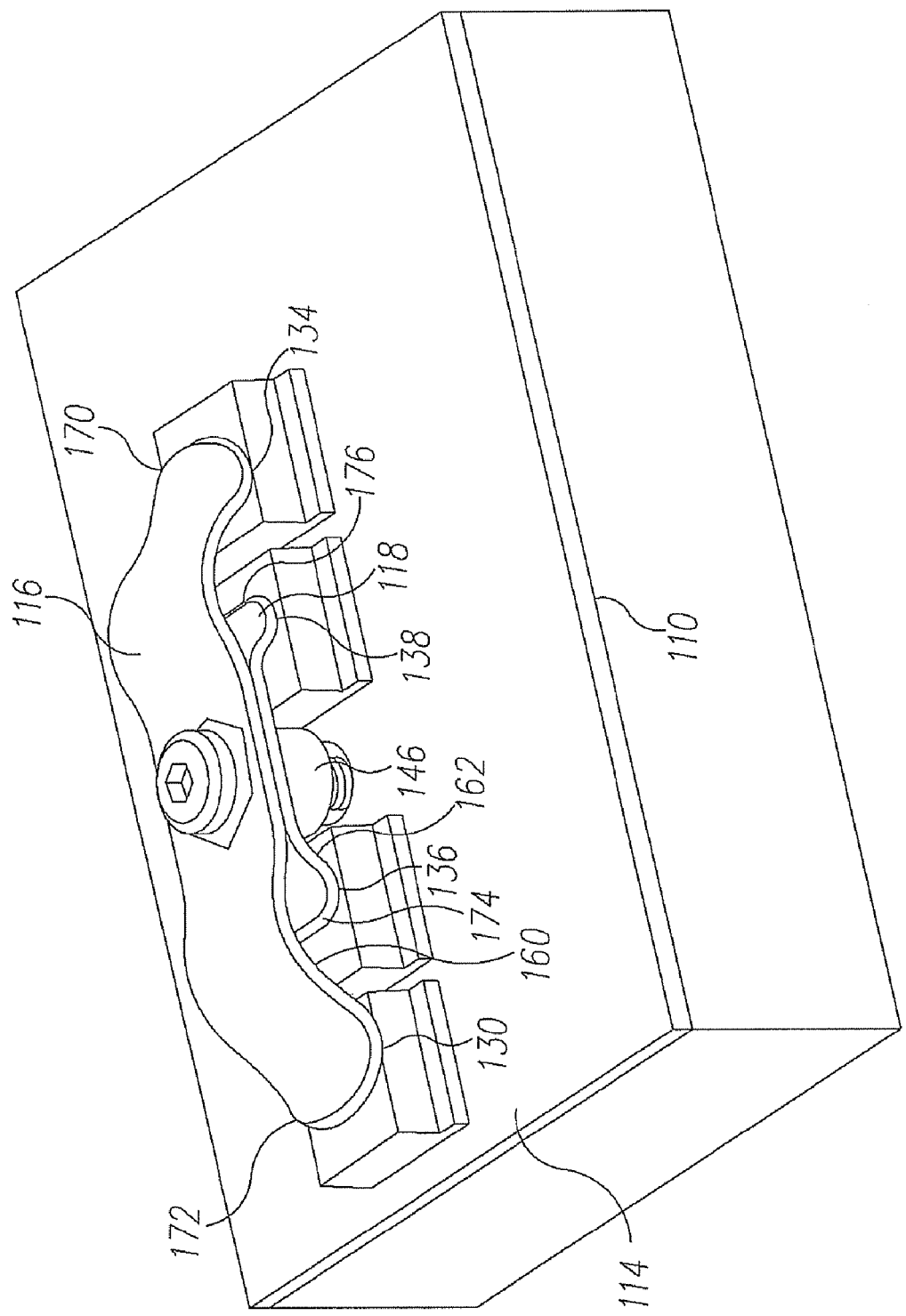
FIG. 1B is a perspective view of the example assembly for clamping electrical components against a heat-dissipating surface illustrated in FIG. 1A.

FIG. 1B is a perspective view of the example assembly for clamping electrical components against a heat-dissipating surface illustrated in FIG. 1A. The second surface of the first resilient member 116 may have a concave shape 160 facing the heat-dissipating surface 110. The second surface of the second resilient member 118 may have a concave shape 162 facing the heat-dissipating surface 110. Other shapes are possible. For example, in some configurations, the shapes, 160 and 162, of the second surface of each of the first and second resilient members, 116 and 118, may be planar.

The first and second contact regions, 130 and 134, of the first resilient member 116 may have a convex shape facing the heat-dissipating surface 110. The distal ends, 170 and 172, of the first resilient member 116 may be rounded. The first and second contact regions, 136 and 138, of the second resilient member 118 may have a convex shape facing the heat-dissipating surface 110 or printed circuit board 114. Distal ends, 174 and 176, of the second resilient member 118 may also be rounded. Rounded ends of the resilient members, 116 and 118, may help prevent a person installing the assembly 100 from getting scratched by a sharp corner or from accidentally scratching a surface visible in the final product. In some examples, the distal ends, 170, 172, 174, and 176, may be some other shape.

Figure 2:
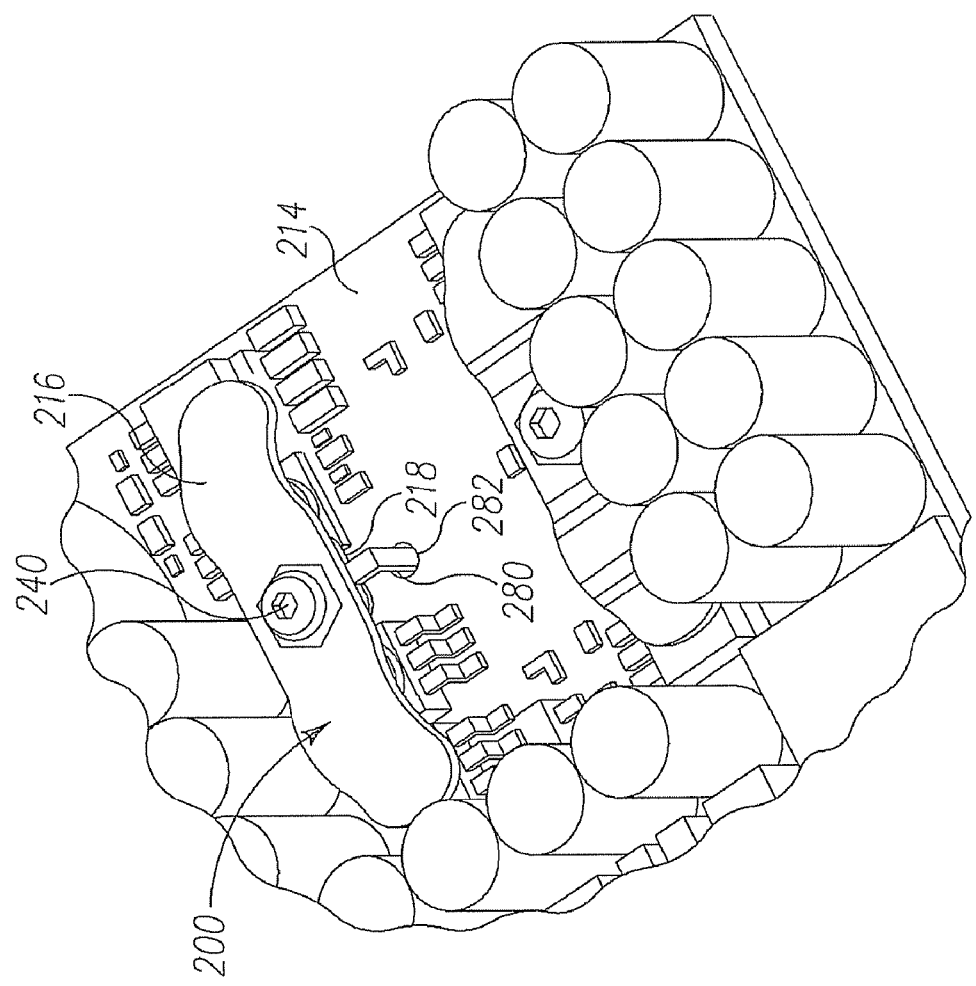
FIG. 2 is an illustration of a second example of an assembly for clamping electrical components against a heat-dissipating surface.

FIG. 2 is an illustration of a second example of an assembly for clamping electrical components against a heat-dissipating surface. The assembly 200 includes a first and second resilient member 216 and 218. The second resilient member 218 may include an alignment leg 280 projected in a direction substantially perpendicular to the second surface of the second resilient member 218. The alignment leg 280 may fit into a slot 282 in the circuit board 214 to align the second resilient member 218 with respect to the circuit board 214 during installation. Because the second resilient member 218 may be coupled to the first resilient member 216, the alignment leg 280 may also align the first resilient member 216 when the fastener 240 is installed. In other examples, the first resilient member 216 may include an alignment leg 280 instead of the second resilient member 218.

Figure 3A:
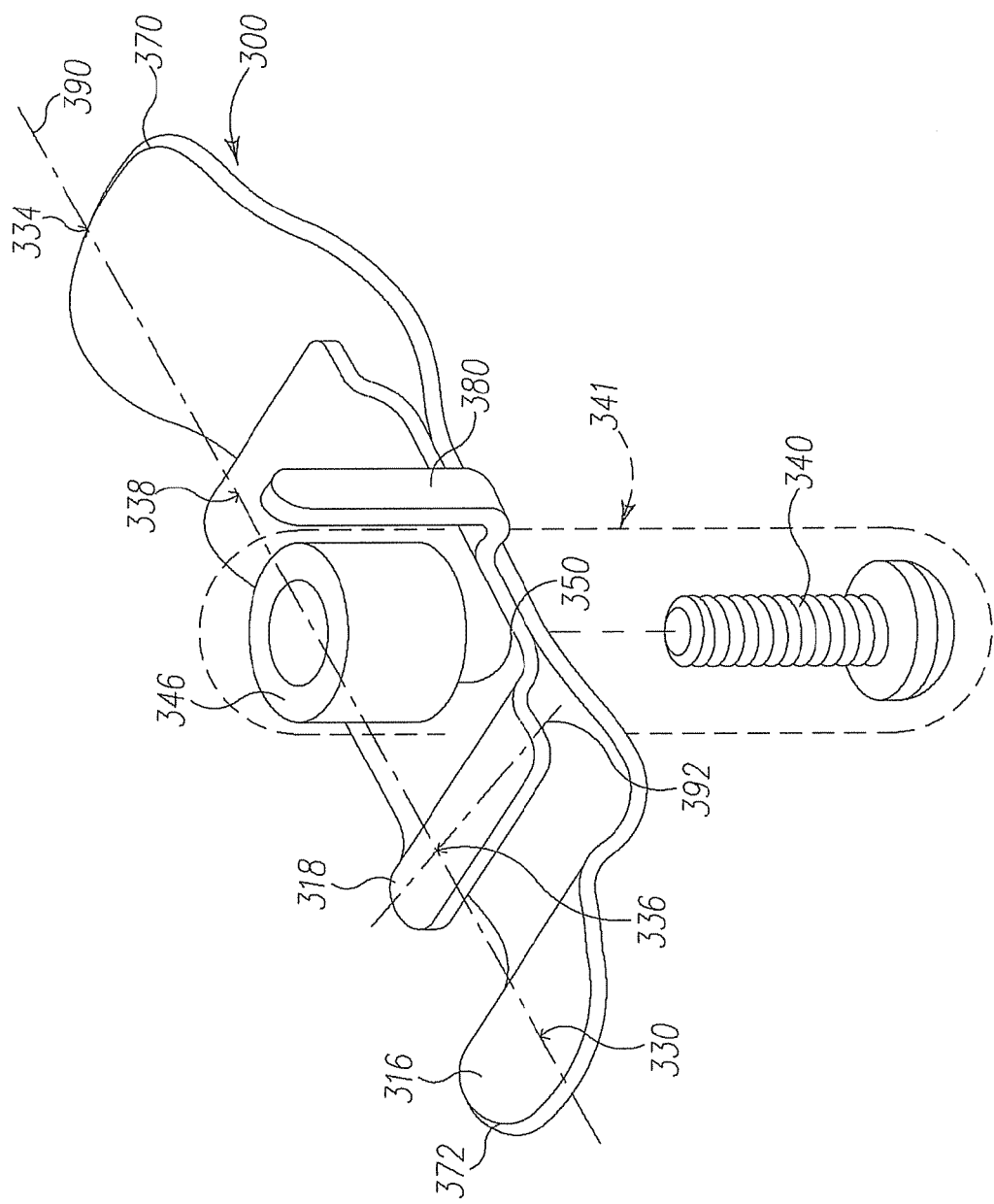
FIG. 3A is a perspective view of an example of a heat sink clamp for holding semiconductor devices against a mounting surface of a heat sink.
Figure 3B:
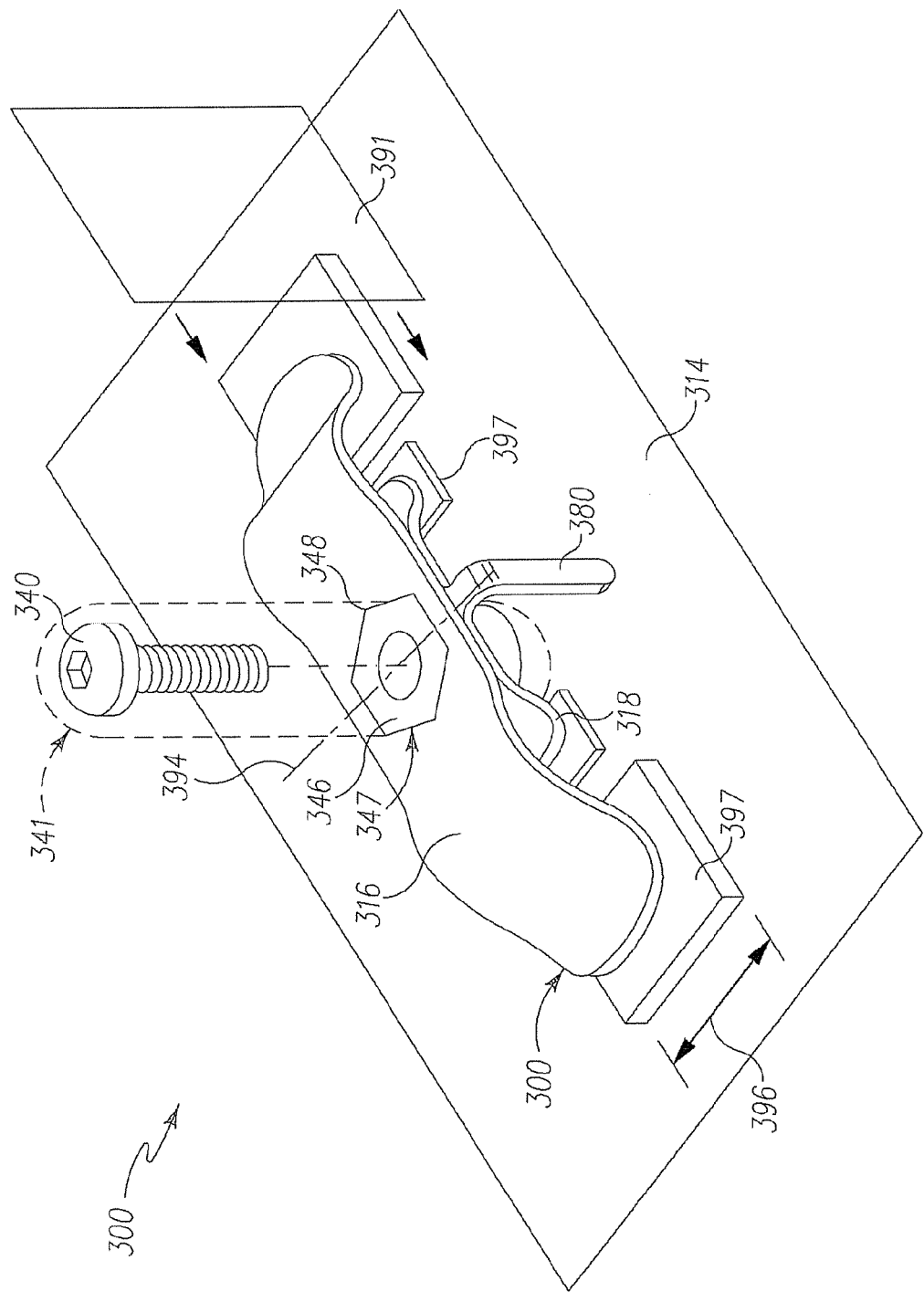
FIG. 3B is another perspective view of the example of a heat sink clamp of FIG. 3A.

FIGS. 3A and 3B are perspective views of an example of a heat sink clamp 300 for holding semiconductor devices 397 against a mounting surface 314 of a heat sink. The heat sink clamp 300 may include a fastener assembly 341. The heat sink clamp 300 may also include two springs, 316 and 318. In other examples, the heat sink clamp may include more than two springs. The term "spring" as used herein, is defined as equivalent to a "resilient member," which was previously described.

Each of the springs may have a first axis 390 and a second axis 392. The second axis 392 is perpendicular to the first axis 390. Each of the springs, 316 and 318, has a first length along the first axis 390 and a second length along the second axis 392. The second length may be shorter than the first length of each spring, 316 and 318. The spring with the longest first length is the longest spring 316 and the spring with the shortest first length is the shortest spring 318. The heat sink clamp 300 may include an alignment leg 380. Alternatively, the heat sink clamp 300 may not include an alignment leg 380.

Each of the springs, 16 and 318, has a first contact point, 330 and 336, located along the first axis 390. In some examples, each of the springs, 316 and 318, may have a second contact point, 334 and 338 located along the first axis 390. Each spring may have fewer or greater contact points in other examples. In one example, each contact point, 330, 334, 336, and 338, may hold a different semiconductor device in thermal contact with a mounting surface than is held by the other contact points. In other examples, a single semiconductor may be held in thermal contact with a mounting surface by more than one contact point.

The fastener assembly 341, described below, may hold the springs, 316 and 318, in a staggered arrangement of decreasing length, where the longest spring 316 is held farthest from the mounting surface 314 and the shortest spring 318 is held closest to the mounting surface 314. In one example, the first length of each of the springs is different from every other one of the springs. In other examples, at least some of the springs may have the same length if the springs are aligned differently, such as perpendicular to each other. The first axis 390 of each spring, 316 and 318, may be collinear. In other examples, the first axis 390 of each spring, 316 and 318, may not be collinear. For example, configurations such as when the springs, 316 and 318, are not aligned along the same axis, or when the contact ends, 336 and 338, of the shortest spring 318 do not lie in the same horizontal plane as the contact ends, 330 and 334, of the longest spring 316.

Figure 4:
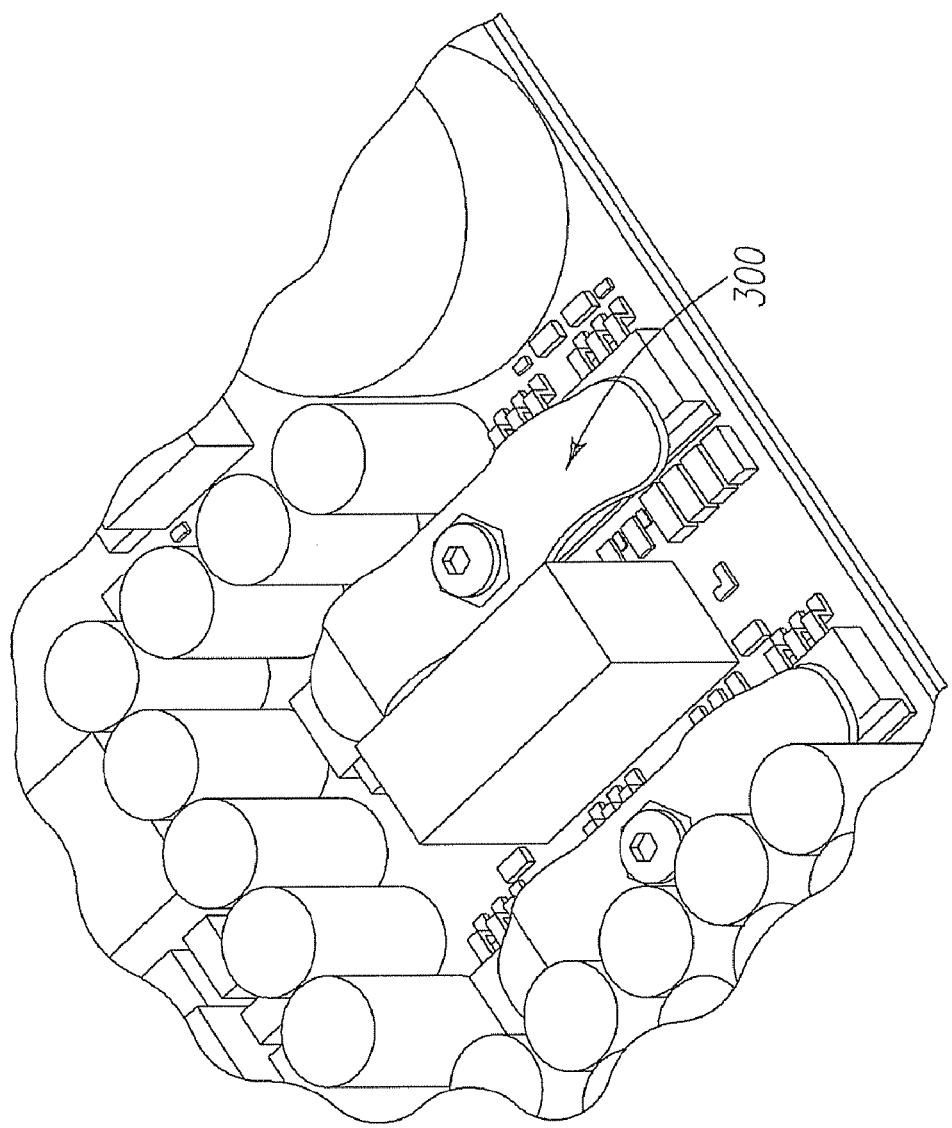
FIG. 4 is an illustration of the example heat sink clamp of FIG. 3A installed in a configuration with little space available for the heat sink clamp.

In one example, the first axis 390 of each spring, 316 and 318, may lie in a single plane 391 that is substantially perpendicular to the mounting surface 314. In that example, the fastener assembly 341 may have a cross-sectional axis 394 perpendicular to the single plane 391. The fastener assembly 341 may have a cross-sectional length along the cross-sectional axis 394. In some examples, the cross-sectional length of the fastener assembly 341 may be less than the maximum of the second length of the springs, 316 and 318. In those examples, the maximum of the second length of the springs, 316 and 318, may be less than a device length 396, where the device length 396 may be the maximum length of the semiconductor devices 397 as measured in a direction perpendicular to the single plane 391. In these latter examples, the heat sink clamp 300 is well-suited for configurations with little space available for the heat sink clamp 300. An example of such a configuration is shown in FIG. 4. In FIGS. 3A, 3B, and 4, the second length of each of the springs, 316 and 318, may be different from the other springs, the same, or some combination thereof. In still other examples, the fastener assembly 341 may have a cross-sectional length larger than the device length 396 and the maximum of the second length of the springs.

The springs, 316 and 318, may have attachment points, 348 and 350. The fastener assembly 341 may couple the springs, 316 and 318, together at the attachment points, 348 and 350. The attachment points of each spring may be located between the first and second contact ends of the spring. Alternatively, if each spring only has a first contact point, 330 or 336, then the attachment points, 348 or 348, may be located at a different point than the first contact point, 330 or 336. The springs 316 and 318 may be coupled with the fastener assembly 341 using any physical or chemical process, such as welded, bonded, screwed, bolted, press-fit, etc.

The fastener assembly 341 may include a spacer 346 and a fastener 340. The fastener 340 may be any now known or later discovered fastener, such as a screw, bolt, rivet, weld, barb fit into an opening formed in a mounting surface 314, etc. The fastener assembly 341 may include only one fastener 340. The fastener assembly 341 may include a spacer 346 with a cross-sectional shape 347. The cross-sectional shape 347 may be any shape, such as a hexagon, circle, square, etc. Each of the springs 316 and 318 may include an aperture with the same shape as the cross-sectional shape 347. The spacer 346 may be press-fit into the aperture of the springs, 316 and 318, to couple the springs together. In another example, the spacer 346 may be press-fit into the aperture of one of the springs, 316 or 318, and the aperture(s) of the other spring(s) are shaped and sized to permit the spacer 346 or a fastener 340 to pass through the apertures of these other springs.

In another example, the fastener assembly 341 may include the fastener 340 and no spacer 346. Each of the springs may include an aperture sized and shaped to permit the fastener 340 to pass through the aperture in each of the springs. In some examples, each of the springs may include rounded ends 370 and 372, located at the ends of the springs, 316 and 318, along the first axis 390.

Figure 5:
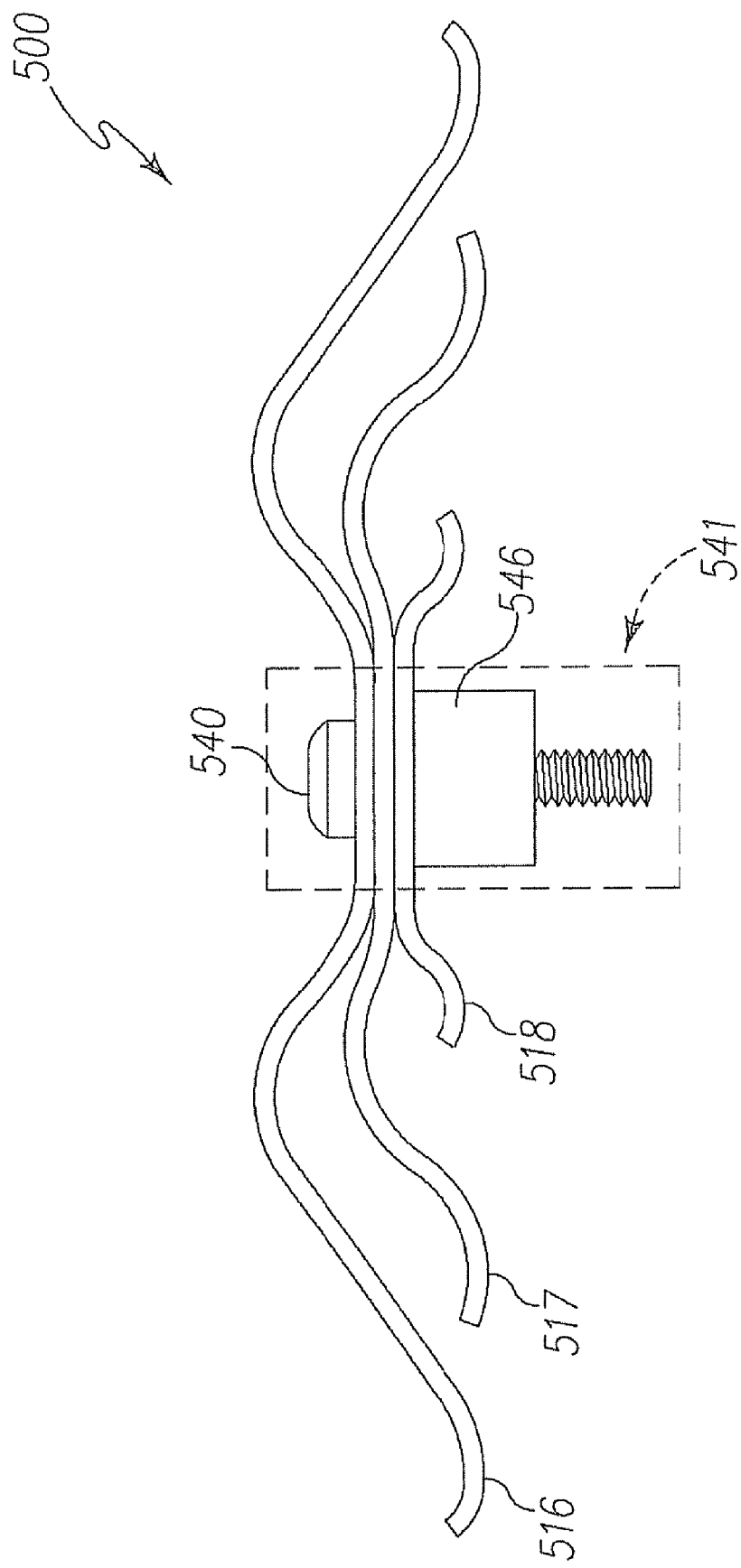
FIG. 5 is a side view of a second example of a heat sink clamp for holding semiconductor devices against a mounting surface of a heat sink.

FIG. 5 is a side view of a second example of a heat sink clamp for holding semiconductor devices against a mounting surface of a heat sink. The heat sink clamp 500 may include three springs, 516, 517, and 518. The heat sink clamp 500 may also include a fastener assembly 541. The fastener assembly 541 may have a fastener 540. In one example, the fastener assembly 541 may have only one fastener 540. The fastener assembly 541 may optionally include a spacer 546. The fastener assembly 541 may couple the springs, 516, 517, and 518, together.

Figure 6:
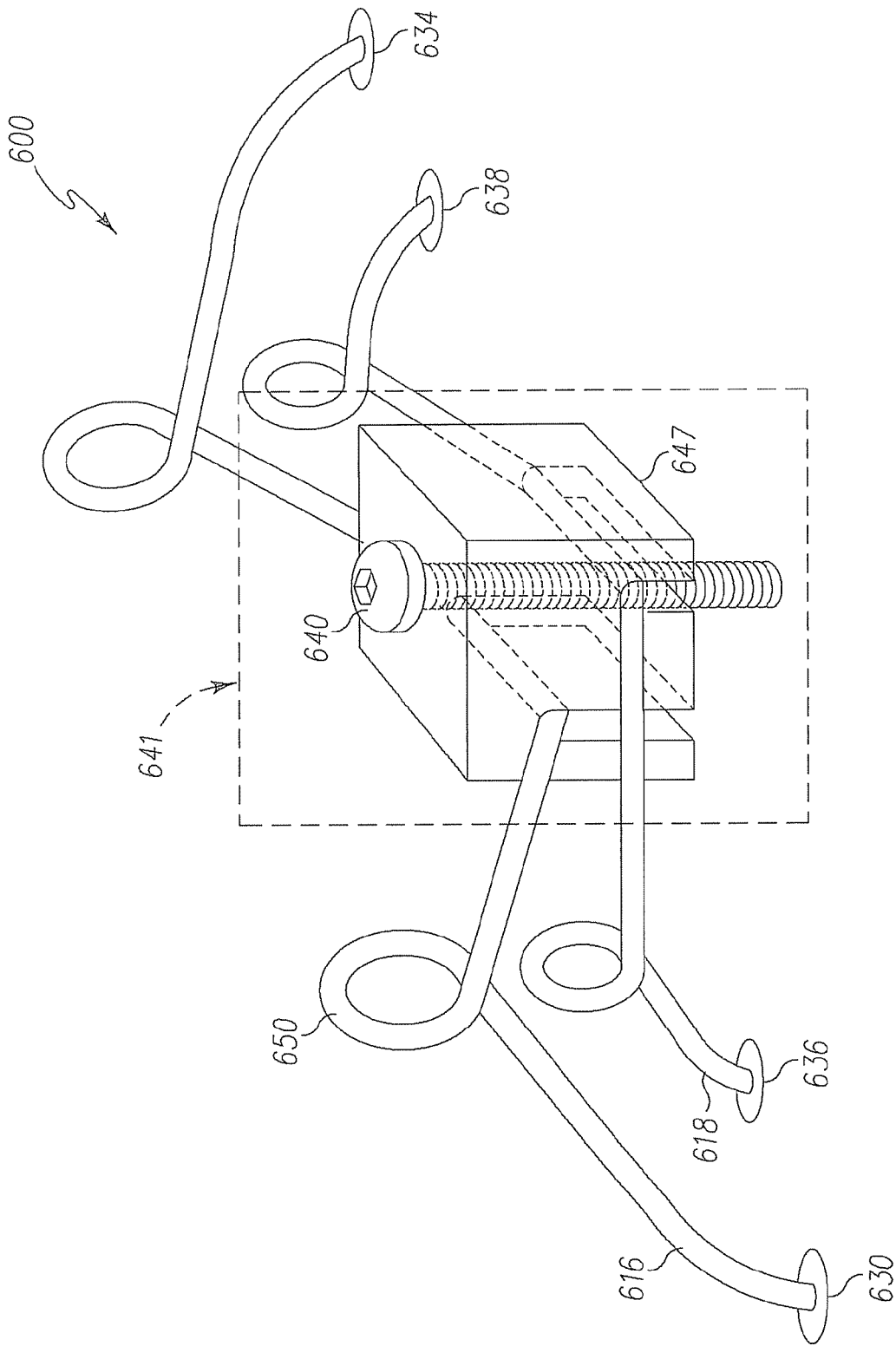
FIG. 6 is a side view of a third example of a heat sink clamp for holding semiconductor devices against a mounting surface of a heat sink.

FIG. 6 is a side view of a third example of a heat sink clamp 600 for holding semiconductor devices against a mounting surface of a heat sink. The heat sink clamp 600 includes at least two springs, 616 and 618. Each spring, 616 and 618, may be a wire spring.

The heat sink clamp 600 may also include a fastener assembly 641 that includes a fastener 640 and a mounting block 647. The mounting block 647 may couple the springs, 616 and 618, together. In one example, the mounting block 647 may be formed to include a slot(s) configured to receive each spring, 616 and 618. The slots may be formed in the side of the mounting block 647 that faces the mounting surface of the heat sink. In other examples, different structures may be used to couple the springs, 616 and 618, together. For example, the mounting block 647 may be formed to include a hole for each spring, 616 and 618, through which the springs, 616 and 618 pass. The block may include a hole through which the fastener 640 passes.

Each spring, 616 or 618, may contain one or more loops 650. Alternately, the springs, 616 and 618 may not have any loops. The spring 616 may be the longest spring and have two contact points, 630 and 634. The spring 618 may be a shorter spring and may have two contact points 636 and 638. However, in other examples, each spring 616 and 618 may have fewer or greater contact points, 630 and 634.

Figure 7:
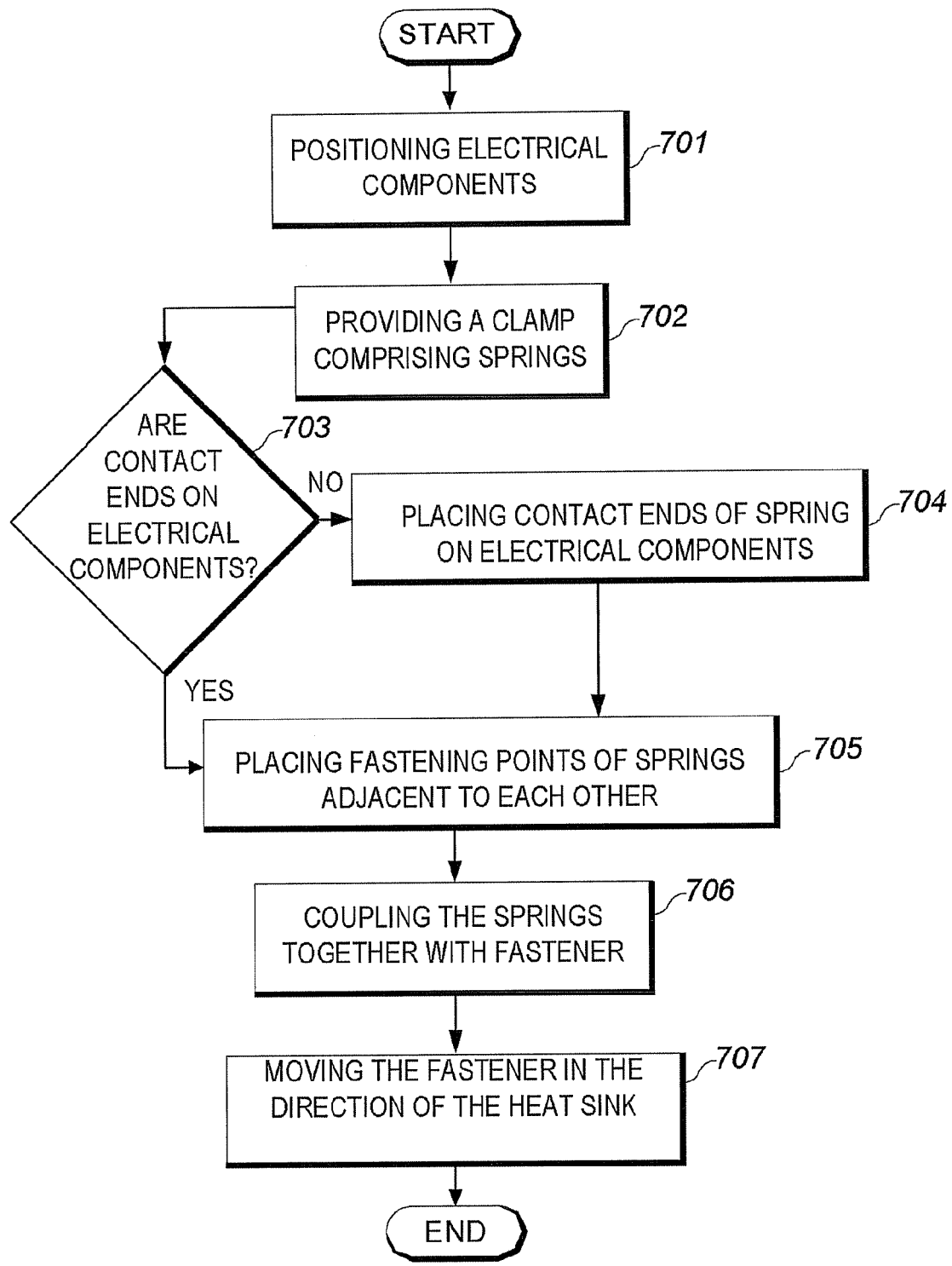
FIG. 7 illustrates an example flow diagram illustrating an operation of clamping electrical components against a surface of a heat sink or against a surface in thermal contact with the heat sink.

FIG. 7 is a flow diagram illustrating an example operation of clamping electrical components against a surface of a heat sink or against a surface in thermal contact with the heat sink. The operation begins, at block 701, by positioning electrical components in thermal contact with a heat sink surface. The electrical components may have a first side and a second side, where the first side is opposite of the second side and the second side faces the heat sink surface. In one example, the operation may further include arranging the electrical components along a single axis running parallel to the heat sink surface. In other examples, the electrical components may be arranged randomly or in some other order, such as in a circular pattern, square pattern, asymmetrical pattern, etc. FIG. 7 does not suggest a special order of performing the steps of the operation. Instead, each step may be performed in any order provided that moving the fastener in the direction of the heat sink, at block 707, is performed last.

Providing a clamp that includes springs occurs at block 702. In one example, providing a clamp may include only providing separate springs. In another example, the clamp may also include a fastener assembly operable to couple the springs together.

Checking whether the contact ends of the springs are on electrical components occurs at block 703. If the contact ends are not in contact, then placing the contact ends of the springs on electrical components occurs at block 704. Each spring may have a first contact end, a second contact end, or more than two contact ends. Each contact end may physically contact the first side of an electrical component. Alternatively or in addition, all or some of the contact ends may touch some other material (not shown) interspersed between the contact ends and the first sides of the electrical components. For example, a protective material may be used to protect the electrical components from damage such as cracking or scratching. Each contact end of each spring may contact a different electrical component than the other contact ends contact. Alternatively, multiple contact ends may touch the same electrical component.

In some examples, the operation may include aligning the springs in a direction defined by a single axis along which all the electrical components are arranged. In yet another example, the operation may also include stacking the springs in a stacking plane that contains the single axis and is substantially perpendicular to the heat sink surface. In the latter example, the operation of clamping electrical components may also include an initial step of sizing the springs to ensure that the maximum width of the springs measured in a direction perpendicular to the stacking plane is equal to or less than the maximum width of the electrical components measured in the same direction.

If the contact ends of the springs are on the electrical components, then placing a fastening point of each of the springs adjacent to all other fastening points of the springs occurs at block 705. The term "adjacent" is defined to mean near or close by, not necessarily in contact. Each fastening point may be placed in such proximity to the other fastening points as to permit either the fastener or the fastener assembly to couple the springs. When placing the fastening point of each of the springs adjacent to all other fastening points of the springs, at block 705, each contact end of the springs may remain in contact with the first side of an electrical component.

Coupling the springs together at the fastening point of each spring with a fastener occurs at block 706. The springs may be coupled in any number of ways, such as welding, riveting, fitting a fastener through an aperture of each spring, etc. In some examples, the fastener may be a single fastener. Alternatively, the springs may be coupled together with a fastener assembly such as by press-fitting the springs onto a spacer or by locking the springs into slots configured to receive the springs made in a mounting block.

Finally, at block 707, the operation of clamping electrical components concludes with moving the fastener in the direction of the heat sink. Moving the fastener in such a matter causes the springs to deform and the contact ends of each spring to clamp the electrical components against the heat sink surface.

The operation may include securing the springs to the heat sink with the fastener. Any manner of securing with a fastener, now know or later discovered, may be used. Alternatively, the operation may not include securing the springs to the heat sink with the fastener. Instead, the operating may include coupling the clamp to a housing cover, and placing the housing cover over a housing opening to move the fastener in the direction of the heat sink.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. An assembly for clamping electrical components against a heat-dissipating surface of a heat sink, the assembly comprising:
   a heat sink comprising a heat-dissipating surface;
   a plurality of electrical components comprising a first electrical component a second electrical component, a third electrical component, and a fourth electrical component;
   a plurality of resilient members comprising a first resilient member and
   a second resilient member, where:
      each of the first resilient member and the second resilient member comprises a first surface and a second surface opposite the first surface;
      the second surface of each of the first resilient member and the second resilient member comprises a contact region, a second contact region, and an attachment region located between the first contact region and the second contact region;
      the second surface of the first resilient member positioned to overlap the first surface of the second resilient member;
      the first contact region of the second surface of the first resilient member positioned to hold the first electronic component against the heat-dissipating surface;
      the first contact region of the second surface of the second resilient member positioned to hold the second electronic component against the heat-dissipating surface;
      the second contact region of the second surface of the second resilient member positioned to hold the third electronic component against the heat-dissipating surface; and
      the second contact region of the second surface of the first resilient member positioned to hold the fourth electronic component against the heat-dissipating surface; and
   a single fastener, the single fastener operable to couple the resilient members to the heat sink in the attachment region of each of the first resilient member and the second resilient member.

2. The assembly of claim 1, where the second surface of each of the first resilient member and the second resilient member has a concave shape facing the heat-dissipating surface.

3. The assembly of claim 2, where each of the first contact region and the second contact region of the second surface of the first resilient member and the second resilient member has a convex shape facing the heat-dissipating surface.

4. The assembly of claim 1, where the electrical components are arranged on the heat-dissipating surface along a single axis to position the first electrical component adjacent the second electrical component, and the third electrical component adjacent the fourth electrical component.

5. The assembly of claim 1, where the single fastener is operable to couple the resilient members to the heat sink through a gap between the second electrical component and the third electrical component.

6. The assembly of claim 1, where the first resilient member is symmetric about the attachment region of the second surface of the first resilient member and the second resilient member is symmetric about the attachment region of the second surface of the second resilient member.

7. The assembly of claim 1, further comprising a spacer interposed between the resilient members and the heat sink.

8. The assembly of claim 1, where distal ends of each of the resilient members are rounded.

9. The assembly of claim 1, further comprising a circuit board interposed between the heat-dissipating surface and the electrical components.

10. The assembly of claim 1, where the second resilient member further comprises an alignment leg projecting in a direction substantially perpendicular to the second surface of the second resilient member.

11. The assembly of claim 10, further comprising a circuit board interposed between the heat-dissipating surface and the electrical components, the circuit board comprising a slot, where the alignment leg is positioned to fit into the slot and to align the second resilient member with respect to the circuit board.

12. A heat sink clamp for holding semiconductor devices against a mounting surface of a heat sink, the heat sink clamp comprising:
   a plurality of springs, each of the springs including:
      a first length along a first axis;
      a second length along a second axis perpendicular to the first axis, the
   second length shorter than the first length;
      a first contact point and a second contact point positioned on the first axis of each of the springs; and
      an attachment point positioned between the first contact point and the second contact point, where each one of the first contact point and the second contact point of each of the springs is positioned to hold a respective one of the semiconductor devices in thermal contact with the mounting surface; and
   a single fastener assembly, where the single fastener assembly is operable to couple the springs together at the attachment point of each of the springs, and the springs overlap and are contiguous at the attachment point.

13. The heat sink clamp of claim 12, where the springs further comprise a first spring and a second spring, where the first length of the first spring is greater than the first length of the second spring, and where the first spring is positioned farther from the mounting surface than the second spring.

14. The heat sink clamp of claim 12, where the fastener assembly comprises only one fastener, the first axis of each of the springs lies in a single plane, and the single plane is substantially perpendicular to the mounting surface.

15. The heat sink clamp of claim 14, where the fastener assembly includes a cross-sectional axis perpendicular to the single plane, and the fastener includes a cross-sectional length along the cross-sectional axis, where the cross-sectional length and the second length of each of the springs is less than or equal to a semiconductor device length, as measured in a direction of the cross-sectional axis, of one or more semiconductor devices held by the springs in thermal contact with the mounting surface.

16. The heat sink clamp of claim 12, where:
   the fastener assembly further comprises a spacer having a cross-sectional shape;
   each of the springs further comprises an aperture located at the attachment point, the aperture formed with a predetermined shape;
   the predetermined shape of the aperture of the first spring is formed to substantially match the cross-sectional shape of the spacer, the spacer fit into the aperture of the first spring and affixed to the first spring; and
   the predetermined shape of the aperture of all of the springs except the first spring formed to permit the spacer to pass through the aperture of all of the springs except the first spring, without the spacer being affixed to all of the springs except the first spring.

17. The heat sink clamp of claim 12, where each of the springs further comprises rounded ends located along the first axis of each of the springs.

18. A method of clamping a plurality of electrical components against a heat sink surface, the clamping method comprising:
   positioning a plurality of electrical components in thermal contact with a heat sink surface, each of the electrical components comprising a first side and a second side opposite the first side, where the second side of each of the electrical components faces the heat sink surface;
   providing a clamp comprising a plurality of springs;
   placing a first contact end of each respective one of the springs in contact with the first side of a respective one of the electrical components;
   placing a second contact end of each respective one of the springs in contact with the first side of another respective one of the electrical components;
   positioning the springs to overlap at a fastening point of each of the springs, the fastening point of each of the springs between the first contact end and the second contact end of the respective one of the springs;
   coupling the springs together at the fastening point with a fastener; and
   moving the fastener toward the heat sink surface causing:
      the springs to deform;
      the first contact end of each respective one of the springs to clamp, against the heat sink surface, the respective one of the electrical components in contact with the first contact end of each respective one of the springs; and
      the second contact end of each respective one of the springs to clamp, against the heat sink surface, the another respective one of the electrical components in contact with the second contact end of each respective one of the springs.

19. The method of claim 18, further comprising:
   securing the springs to the heat sink surface with the fastener, where the fastener is a single fastener.

20. The method of claim 18, where:
   positioning the electrical components includes arranging the electrical components along a single axis; and
   providing a clamp includes aligning the springs in a direction defined by the single axis, and stacking the springs in a stacking plane, where the stacking plane contains the single axis and is perpendicular to the heat sink surface.

21. The method of claim 18, further comprising an initial step of sizing the springs to ensure that a width of the springs measured in a direction perpendicular to the stacking plane is equal to or less than a width of the electrical components measured in the direction perpendicular to the stacking plane.

22. The method of claim 18, where the step of coupling the springs together at the fastening point of each of the springs with the fastener further comprises press-fitting the fastener to at least one of the springs.

23. The method of claim 18, where:
   positioning the electrical components includes arranging the electrical components along a single axis; and
   providing a clamp includes aligning the springs in a direction defined by the single axis, stacking the springs in a stacking plane, one of the springs completely covering any one of the springs that is closer to the heat sink surface, and where the stacking plane contains the single axis and is perpendicular to the heat sink surface.

* * * * *

UNITED STATES PATENT AND TRADEMARK OFFICE
CERTIFICATE OF CORRECTION

PATENT NO. : 7,746,653 B2  Page 1 of 1
APPLICATION NO. : 11/968532
DATED : June 29, 2010
INVENTOR(S) : Florin Negrut It is certified that error appears in the above-identified patent and that said Letters Patent is hereby corrected as shown below:

In the Claims

In Column 10, Line 2, insert --,-- after "component" (first instance).

In Column 10, Line 11, insert --first-- after "a" and before "contact.".

Signed and Sealed this

Twenty-fourth Day of August, 2010

David J. Kappos
*Director of the United States Patent and Trademark Office*